Figure 1:
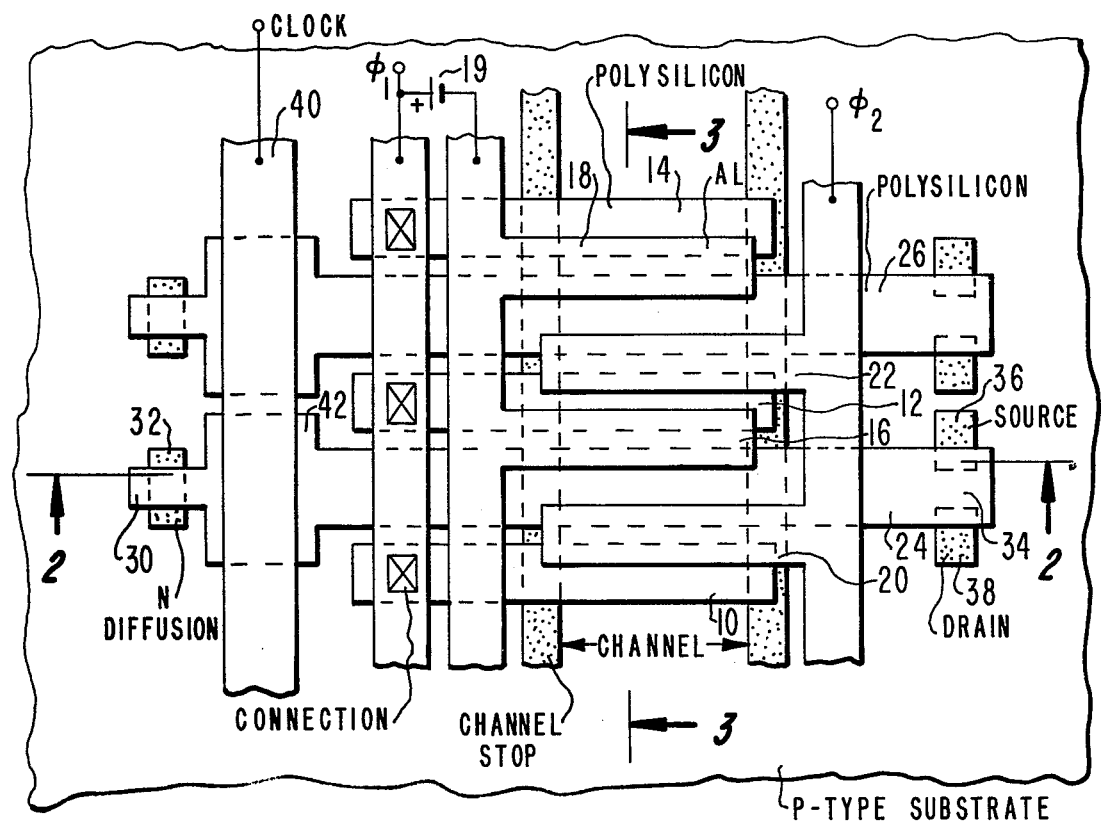

United States Patent [19]

Herrmann

[11] 4,090,095
[45] May 16, 1978

[54] CHARGE COUPLED DEVICE WITH DIODE RESET FOR FLOATING GATE OUTPUT

[75] Inventor: Eric Peter Herrmann, Bound Brook, N.J.

[73] Assignee: RCA Corporation, New York, N.Y.

[21] Appl. No.: 810,392

[22] Filed: Jun. 27, 1977

Related U.S. Application Data

[63] Continuation of Ser. No. 658,677, Feb. 17, 1976, abandoned.

[51] Int. Cl.² .................... G11C 19/28; H01L 29/78; H01L 29/04
[52] U.S. Cl. .................... 307/221 D; 357/24; 357/59
[58] Field of Search ............ 357/24; 307/221 D, 304

[56] References Cited

U.S. PATENT DOCUMENTS

| | | | |
|---|---|---|---|
| 3,523,132 | 11/1971 | Green | 357/24 |
| 3,758,794 | 9/1973 | Kosonocky | 357/24 |
| 3,845,331 | 10/1974 | Luscher | 357/24 |
| 3,949,245 | 4/1976 | Emmons | 357/24 |
| 3,950,655 | 4/1976 | McLennan et al. | 357/24 |

OTHER PUBLICATIONS

Wen "Design and Operation of a Floating Gate Amplifier" IEEE J. Solid-State Circuits vol. SC-9 (12/74) pp. 410-414.
Frantz et al. "Mosfet Substrate Bias-Voltage Generator" IBM Technical Disclosure Bulletin vol. 11 (3/69) p. 1219.
Sequin et al. *Charge Transfer Devices* Academic Press N.Y. (7/75) pp. 4, 28-30, 42-44, 48-50, 56, 57.

*Primary Examiner*—William D. Larkins
*Assistant Examiner*—Gene M. Munson
*Attorney, Agent, or Firm*—H. Christoffersen; Samuel Cohen

[57] ABSTRACT

An output electrode of a charge coupled device (CCD) register comprises a conductor which is insulated from the substrate over the major portion of its length and which is connected at one end to a diffusion in the substrate of opposite conductivity type than the substrate. A voltage source capacitively coupled to the output electrode supplies a voltage which varies between two levels. In response to one of these levels, the output electrode assumes a potential such that charge signal may accumulate in the region of the substrate beneath the output electrode and at which the semiconductor junction between the diffusion and the substrate is reversed biased. In response to the transition of the voltage from the one to its other level, the junction becomes forward biased and clamps the output electrode to the substrate potential.

8 Claims, 4 Drawing Figures

CHARGE COUPLED DEVICE WITH DIODE RESET FOR FLOATING GATE OUTPUT

The present application, which is a continuation of application Ser. No. 658,677 filed Feb. 17, 1976, now abandoned, deals with charge coupled devices (CCD's) and particularly with output structures therefor.

It is known in the art to employ so called "floating gate" electrodes as the output electrodes of CCD's. In some cases there is a single such electrode at the output end of the CCD. In other cases there are a multiplicity of such electrodes along the length of a CCD register for producing parallel outputs. During one period of time, such an electrode may be placed at a potential such that a potential well is present in the substrate beneath the electrode. The change in potential of the gate electrode in response to the shifting into this potential well of a charge signal is employed as an output signal of the CCD. In the cases where it is desired, after an output signal is sensed, to propagate the charge signal present beneath the floating gate electrode to a following stage of the CCD, it is necessary to change the potential of the floating gate electrode to a second level at which the depth of the potential well beneath this electrode is reduced.

There are a number of ways known in the art for obtaining the operation described above. One employs a field effect transistor for each floating gate electrode. The field effect transistor may be turned on and a first potential applied through the conduction path thereof and then the field effect transistor may be turned off leaving the gate in a high impedance condition, at the desired potential. Thereafter, the field effect transistor may be turned on again and the floating gate electrode set to a second potential (such as ground) through the conduction path of the transistor, for reducing the depth of the potential well beneath the floating gate electrode and thereby permitting the charge signal previously stored to propagate to the next stage. A second method involves the use of a direct voltage and a capacitive voltage divider, the tap of which is connected to the floating gate electrode. By changing the voltage across the voltage divider, the floating gate electrode can be switched between different voltage levels.

In a CCD embodying the present invention, an output gate electrode is insulated from the substrate throughout the major portion of its extent and is connected at one portion thereof to a region in the substrate of opposite conductivity than the substrate. A voltage source capacitively coupled to the gate electrode supplies a voltage which varies between two levels. At one such level, the semiconductor junction between the region and the substrate is reverse biased, isolating the electrode from the substrate. During the transition of the voltage supplied by the source from its first to its second level, the junction becomes forward biased and clamps the electrode to the substrate potential.

Figure 2:
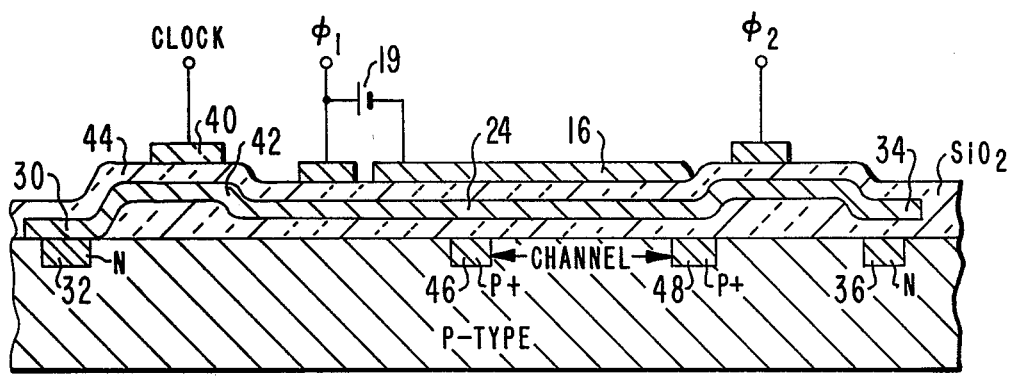
Figure 3:
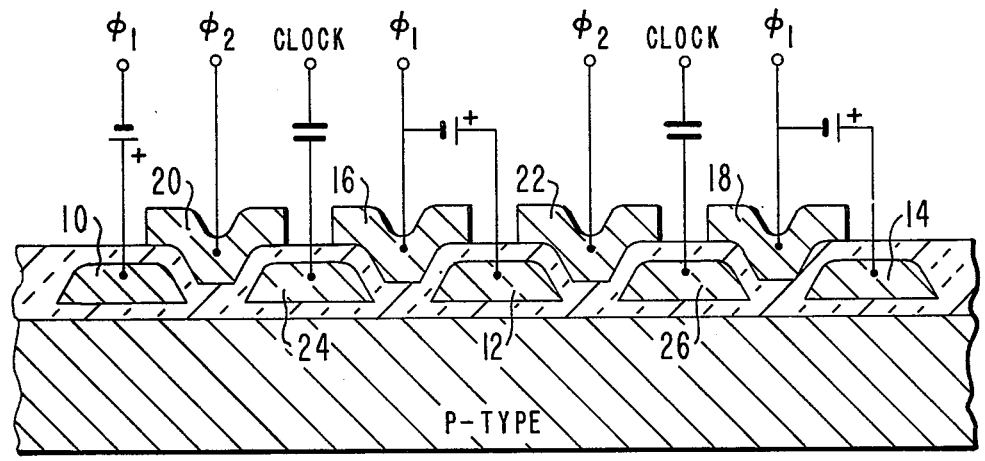
Figure 4:
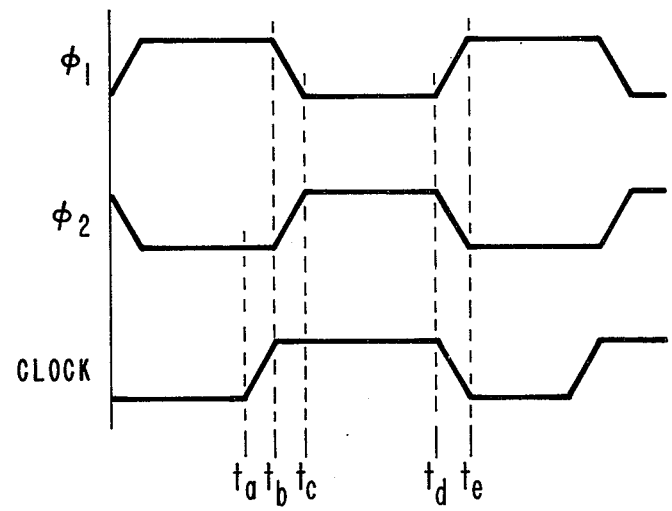

In the drawing:

FIG. 1 is a plan view of a portion of a multiple output CCD register embodying the invention;

FIGS. 2 and 3 are cross sections taken along lines 2—2 and 3—3, respectively, of FIG. 1; and FIG. 4 is a drawing of waveforms that may be used in the operation of the CCD of the previous FIGURES.

Referring to FIGS. 1-3, the CCD illustrated comprises an N channel (P type substrate) device. For purposes of illustration, the electrodes are shown to be formed of polysilicon overlapped at opposite edges by aluminum. It is to be understood, of course, that other forms of electrodes, such as all polysilicon, can be employed and that the invention is equally applicable to P channel (N type substrate) devices with appropriate choice of voltages. Further, while for purposes of this discussion, the CCD is assumed to be of the surface channel type, the invention is equally applicable to buried channel CCD's.

The polysilicon electrodes driven by one voltage phase $\phi_1$ are shown at 10, 12 and 14. The overlapping aluminum electrodes driven by the same phase are illustrated at 16, and 18. If desired, the $\phi_1$ voltage applies to the electrodes closer to the substrate (polysilicon) may be more positive than that applied to the electrodes further from the substrate (aluminum) as indicated schematically by battery 19. The phase $2(\phi_2)$ electrodes also are aluminum and are illustrated at 20 and 22. Each such electrode overlaps at one edge of polysilicon phase 1 electrode and at its other edge an output electrode, two such output electrodes being shown at 24 and 26 respectively.

Each output electrode is insulated from the substrate over the major portion of its length and is connected at one end portion 30 thereof to a region 32 in the substrate of opposite conductivity than the substrate. This region 32 may be a diffusion and may be of N conductivity type. The other end portion 34 of an output electrode serves as the gate electrode of an MOS transistor. The source electrode 36 of this transistor comprises a first diffusion in the substrate which is overlapped by the gate electrode, and the drain electrode 38 comprises a second diffusion in the substrate which is also overlapped by the gate electrode 34. These diffusions may be of N conductivity type. The region in the substrate between these source and drain diffusions comprises the conduction path of an output transistor.

The output electrodes 24 and 26 receive their drive voltage from a clock voltage source which is connected to conductor 40. Conductor 40 passes over expanded regions such as 42 of the output electrodes and is capacitively coupled at these expanded regions to the output electrodes via a silicon dioxide ($SiO_2$) insulation layer 44.

The CCD channel is defined by two diffusions 46 and 48 in the substrate of the same conductivity type as the substrate but of higher impurity concentration than the substrate. The function of these "channel stops" is well understood and need not be discussed further.

The operation of the CCD just discussed may be better understood by referring to the waveforms of FIG. 4. It may be assumed that charge signal has been introduced into the CCD via an input structure (not shown). It may also be assumed that when $\phi_1$ goes high, this charge signal (electrons in the case of the P-type substrate assumed) transfers to the potential well in the region of the substrate beneath polysilicon electrode 10. Typical voltage levels for $\phi_1$ are 0 to 10 volts and the voltage offset between the aluminum and polysilicon $\phi_1$ electrodes may be 2 volts (the voltage provided by battery 19). These are examples only, the particular value chosen in any instance depending upon such design criteria as the materials employed, the insulation thickness, the maximum amount of charge it is desired to propagate in each "packet" and so on.

During the period $t_a$ to $t_b$, CLOCK goes high. When CLOCK goes high, the output electrode 24 is driven relatively positive by virtue of the capacitive coupling between conductor 40 and the expanded region 42 of the output electrode. Electrode 42 is ohmically connected to diffusion 32 so that this diffusion also is driven relatively positive. The positive voltage on diffusion 32 reverse biases the P-N junction between diffusion 32 and the P type substrate so that electrode 24 is electrically isolated from the substrate.

When CLOCK goes high in the period $t_a - t_b$, charge signal may be present at the substrate surface beneath electrode 10. However, the potential barrier beneath electrode 20 prevents this charge from propagating to the potential well beneath output electrode 24. Similarly, charge may be present in the potential well beneath electrode 12. However, the shallower potential well beneath electrode 16 prevents the propagation of charge backward from the well beneath electrode 12 to the well beneath electrode 24.

During the period $t_b - t_c$, $\phi_1$ goes low (to ground, for example) and $\phi_2$ goes relatively positive but not as positive as output electrode 24. For example, $\phi_2$ may be at +10 volts and CLOCK may be at +12 volts in the case in which $\phi_1$ varies between +10 volts and ground and in which the battery voltage is 2 volts. The charge carriers stored in th potential well beneath electrode 10 now propagate via the potential well beneath $\phi_2$ electrode 20 to the relatively deeper potential well beneath output electrode 24. The change in potential of electrode 24 which results is detected at output transistor 34, 36, 38. In other words, the electrons propagated to the potential well beneath output electrode 24 reduce the surface potential beneath this electrode. This reduction in potential is coupled to the electrode 24 and is manifested as a negative voltage dip at electrode 24. This reduces the conduction through transistor 36, 34, 38 and this change in conduction is sensed by the circuit (not shown) of which transistor 36, 34, 38 is a part. The transistor, for example, may be operated as a source follower or as the N-channel transistor of a CMOS inverter. There are also many other alternatives.

The same thing as described above occurs at each output electrode which receives a charge signal at its potential well so that a plurality of signals, in parallel, may be produced. Such CCD structures at which multiple output signals, in parallel, are produced are useful in pattern matching circuits, filters, and in many other applications.

After the multiple output signals are sensed, $\phi_2$ and CLOCK go relatively negative (time $t_d - t_e$) for example, to ground, and concurrently $\phi_1$ goes relatively positive. This causes the shift of charge signal from the potential well beneath electrode 24 to the relatively deeper potential well beneath electrode 12 via the relatively shallower well beneath electrode 16. During the transition of electrode 24 from its relatively positive to its relatively negative value (time $t_d - t_e$) the semiconductor junction between diffusion 32 and the substrate becomes forward biased. This clamps electrode 24 to the substrate potential. Thus, the output electrodes automatically are clamped to a reference level, namely the substrate potential, each time charge signals pass from beneath these electrodes to the following electrodes of the CCD and they remain at this level unit CLOCK again goes relatively positive.

The CCD structure of the present invention has a number of features. One is that it permits, by means of a relatively simple structure, the establishment of the desired DC operating potentials on the output electrode. Another is that the output electrode structure over the CCD channel can be made geometrically and electrically substantially identical to that of the corresponding electrodes (the polysilicon ones, in this example) driven by one (or more) of the multiple phase voltages. This is clearly shown, for example, in the cross section of FIG. 3. The importance of such similar structures is that it permits more uniform output signals to be obtained, that is, the output signals will not have electrically perterbations due to asymmetries in electrode geometry. Finally, using the structure described permits large numbers of output taps to be realized, while still permitting normal CCD action.

The waveform diagram of FIG. 4 is intended as an example only as a number of alternatives are possible. For example, CLOCK and $\phi_2$ may be identical in phase rather than as shown. Further, the structure shown for automatically clamping an electrode to the substrate potential may be operated by two, three, four or a higher number of power supply phases.

What is claimed is:

1. A charge-coupled device (CCD) register output stage comprising, in combination:

a semiconductor substrate of given conductivity type and at a given potential, said substrate formed with a CCD channel along which charge can propagate;

a group of $n$ adjacent electrode means, each such electrode means capacitively coupled to said CCD channel for the storage and propagation of charge, where $n$ is an integer greater than 2;

$n$-1 connections for a $n$-1 phase voltage source connected to $n$-1 of the electrode means, respectively, of said group of $n$ electrode means, the remaining electrode means of said group comprising an output electrode;

output means coupled to said output electrode for producing an output signal of a value dependent upon the amount of charge propagated to the region of said channel adjacent to said output electrode;

a region in the substrate outside of said CCD channel, said region being of opposite conductivity type than the substrate and forming a semiconductor junction with said substrate, said region operating as one electrode of a simple semiconductor diode, the substrate operating as the other electrode of this simple diode;

said output electrode being insulated from the substrate over the major portion of its length and being in ohmic contact with said region of opposite conductivity type at one portion thereof; and means capacitively coupled to said output electrode at a portion thereof outside of said channel for applying to said output electrode first and second voltage levels, said first level being such as to produce on said output electrode a given voltage level at which a depletion region for the storage of charge forms in the substrate to thereby permit the transfer of charge to said depletion region and at which said semiconductor junction is reverse biased, whereby there is a high impedance between said output electrode and said substrate and said output electrode remains at substantially said given voltage level for the duration of said first level, and the change in said applied voltage from said first to said second level being in a sense and amount to reduce the depth of said depletion region to thereby facilitate the transfer of charge away from said depletion region and to concurrently forward bias said semiconductor junction for clamping said ouput electrode to said given potential of said substrate of said given conductivity type during the period said second voltage level is present.

2. In the combination as set forth in claim 1, said output means comprising, in the region of the substrate at one end portion of said output electrode, first and second spaced regions in said substrate of opposite conductivity than said substrate, said end portion of said output lying over the space between said regions and overlapping said regions, said space in the substrate between said regions comprising the conduction path of transistor, said first and second regions comprising the source and drain electrodes of said transistor and said end portion of said electrode comprising the gate electrode of said transistor.

3. In the combination as set forth in claim 2, said region of ohmic contact with said output electrode being located at the end portion of said output electrode opposite that at which said transistor is located.

4. In the combination as set forth in claim 1, one portion of said output electrode being of substantially greater width than the remainder of said output electrode and being spaced substantially further from the substrate than the portion of the output electrode capacitively coupled to said channel, said means capacitively coupled to said output electrode comprising a conductor crossing and insulated from said output electrode and passing over said one portion thereof of substantially greater width than the remainder of said output electrode.

5. A charge coupled device register with a plurality of output means comprising, in combination:

a semiconductor substrate of given conductivity type and at a given potential;

a plurality of register stages, each stage comprising at least a first electrode insulated from and capacitively coupled to the substrate and a second electrode adjacent to the first electrode capcitively coupled to the substrate and insulated from the substrate over the major portion of its extent;

means coupled to each first electrode for driving the same between two voltage levels, one at which a potential well is formed in a region of the substrate beneath said first electrode for accumulating a charge signal, and the other voltage level at which the depth of the potential well is reduced for propagating the charge signal away from said region of the substrate beneath said first electrode;

each register stage including a region of the substrate of opposite conductivity than the substrate ohmically connected to the second electrode of that register stage and forming a semiconductor junction with said substrate, said region operating as one electrode of a simple diode and said substrate operating as the other electrode of said simple diode;

means capacitively coupled to all of said second electrodes for applying to each second electrode a voltage which switches between first and second levels, said first level being such as to produce a given voltage level on each second electrode at which said semiconductor junction is reversed biased and at which a potential well is formed in a region of the substrate beneath said second electrode for receiving the charge signal propagated away from the first electrode in the same stage, and the change in said applied voltage and said first to said second level being in a sense and amount to forward bias said semiconductor junction and thereby clamp all second electrodes to said given potential of said substrate of given conductivity type, whereby charge signal present in said region of said substrate beneath each second electrode is propagated away from said region; and a plurality of output means, one at each second electrode for producing a plurality of output signals indicative of the charge signals passing to the regions of the substrate beneath the respective second electrode means.

6. A charge coupled device register as set forth in claim 5 wherein each output means comprises a transistor having a control electrode, said control electrode comprising an end portion of a second electrode, and each transistor including input and output electrodes integrated into said semiconductor substrate and coupled to said control electrode.

7. A circuit which includes a semiconductor substrate of given conductivity type at a given potential and a so-called "floating gate" electrode for a charge coupled device (CCD), said electrode comprising a conductor capacitively coupled to a portion comprising a CCD channel of said semiconductor substrate for storing and propagating charge in said CCD channel, and means for operating said electrode comprising, in combination:

a region in said substrate outside of any CCD channel, that is, outside of any region of the substrate in which charge is stored or propagated, said region being of opposite conductivity than the substrate and forming a semiconductor junction with said substrate and ohmically connected to a portion of said electrode, said region operating as an electrode of a simple diode and said substrate operating as the other electrode of said simple diode;

means capacitively coupled to said floating gate electrode for applying first and second voltage levels to said floating gate electrode, the first for producing at said floating gate electrode a voltage level at which a depletion region for the accumulation of charge is formed in said CCD channel and at which said semiconductor junction is reverse biased, whereby said floating gate electrode remains substantially at said given level for the duration of said first level, and the transistion from said first to said second level being of a sense and amount to reduce the depth of said depletion region in said CCD channel to thereby facilitate the transfer of charge away from said depletion region and to also forward bias said semiconductor junction and thereby clamp said electrode to said given substrate potential for the duration of said second level; and means for shifting a charge to a region of the CCD channel adjacent to said depletion region at the time said first level is applied to said floating gate electrode, whereby said charge flows into said depletion region.

8. A circuit as set forth in claim 7 wherein said means for applying first and second voltage levels to said floating gate electrode is capacitively coupled to said floating gate electrode outside of said channel, and wherein said floating gate electrode is spaced substantially further from the substrate at the region thereof to which said means is capacitively coupled than said electrode is spaced from said CCD channel.

* * * * *